United States Patent [19]
Araki et al.

[11] Patent Number: 5,798,896
[45] Date of Patent: Aug. 25, 1998

[54] APPARATUS FOR DETECTING A MAGNETIC FIELD USING A GIANT MAGNETORESISTANCE EFFECT MULTILAYER AND METHOD FOR PREVENTING AN OUTPUT REDUCTION OF THE MULTILAYER

[75] Inventors: Satoru Araki; Osamu Shinoura; Yuuichi Sato; Yuuji Honda, all of Chiba, Japan

[73] Assignee: TDK Corporation, Tokyo, Japan

[21] Appl. No.: 851,959

[22] Filed: May 6, 1997

Related U.S. Application Data

[62] Division of Ser. No. 198,584, Feb. 18, 1994, Pat. No. 5,657,190.

[30] Foreign Application Priority Data

Mar. 2, 1993 [JP] Japan ................................. 5-41495

[51] Int. Cl.$^6$ .......................................................... G11B 5/39
[52] U.S. Cl. .......................................................... 360/113
[58] Field of Search .......................... 360/113; 338/32 R; 324/252

[56] References Cited

U.S. PATENT DOCUMENTS

| | | | |
|---|---|---|---|
| 5,159,513 | 10/1992 | Dieny et al. | 360/113 |
| 5,428,491 | 6/1995 | Smith | 360/113 |
| 5,442,508 | 8/1995 | Smith | 360/113 |
| 5,447,781 | 9/1995 | Kano et al. | 428/212 |
| 5,452,163 | 9/1995 | Coffey et al. | 360/113 |

*Primary Examiner*—Stuart S. Levy
*Assistant Examiner*—David D. Davis
*Attorney, Agent, or Firm*—Oblon, Spivak, McClelland, Maier & Neustadt, P.C.

[57] ABSTRACT

For preventing output drop with time of a MR magnetic head or similar apparatus including a magnetic field sensor in the form of a giant magnetoresistive element of the induced ferrimagnetic or spin-valve type in which antiparallelism of magnetization is induced between the magnetic layers by external magnetization, a magnetic field detecting apparatus comprising a magnetic field sensor using a giant magnetoresistive multilayer film of the induced ferrimagnetic type or the like includes a magnetic field generating means such as a permanent magnet. The magnetic field sensor is moved to the proximity of the magnetic field generating means and placed within the magnetic field when the magnetic field sensor is out of use or its detection sensitivity drops.

2 Claims, 4 Drawing Sheets

APPARATUS FOR DETECTING A MAGNETIC FIELD USING A GIANT MAGNETORESISTANCE EFFECT MULTILAYER AND METHOD FOR PREVENTING AN OUTPUT REDUCTION OF THE MULTILAYER

This is a Division of application Ser. No. 08/198,584 filed on Feb. 18, 1994, now U.S. Pat. No. 5,657,190.

BACKGROUND OF THE INVENTION

1. Field of the Invention

This invention relates to a magnetic field detecting apparatus comprising a multilayer film of the induced ferrimagnetic type or the like having a giant magnetoresistance ratio, especially a magnetic field detecting apparatus comprising a magnetoresistive head capable of reading a small magnetic field change as a large electrical resistance change signal and a method for preventing output drop of such a multilayer film.

2. Prior Art

With recent growing demands for increasing the sensitivity of magnetic sensors and increasing the density of magnetic recording, active research works have been devoted for the development of magnetoresistance effect type sensors (referred to as MR sensors, hereinafter) and magnetoresistance effect type heads (referred to as MR heads, hereinafter) both utilizing a magnetoresistance change. Both MR sensors and MR heads are designed to read out external signals by detecting changes in the electrical resistance of a magnetic field sensor formed of magnetic material. In conjunction with size reduction of recording medium, conventional inductive heads adapted to read information from the recording medium produce an output which lowers with a lowering of the relative speed of the head to the medium, whereas the MR heads have the advantage of producing high outputs in high density magnetic recording since the reproduced output does not depend on the relative speed of the head to the recording medium. Conventional MR heads include a sensor portion generally formed of $Ni_{0.81}Fe_{0.19}$ (Permalloy) and this Permalloy offers only a magnetoresistance ratio as small as about 2% and is low in sensitivity as the MR head material intended for reading ultrahigh density records of the order of several GBPI.

Recently reported were multilayer films having a significantly higher magnetoresistance ratio than the Permalloy and similar alloy films. These films are designated artificial superlattices having the structure in which thin films of metal having a thickness of an atomic diameter order are periodically stacked. Among them, the Fe/Cr superlattice was reported to exhibit a magnetoresistance change in excess of 40% at cryogenic temperature (4.2K) (see Phys. Rev. Lett., Vol. 61, page 2472, 1988). This artificial superlattice, however, is not commercially applicable as such because the external magnetic field at which a maximum resistance change occurs (that is, operating magnetic field intensity) is as high as ten to several tens of kilooersted (kOe). Additionally, there have been proposed artificial superlattices of Co/Cu or the like, which also require too high operating magnetic field intensity.

Among these giant magnetoresistive films, one artificial superlattice known as the induced ferrimagnetic type can be operated at a relatively low magnetic field intensity (Jpn. J. Appl. Phys., Vol. 59, page 3061, 1990). It includes two magnetic layers of different coercive forces Hc with a non-magnetic layer interleaved therebetween wherein antiparallelism of magnetization of two magnetic layers is induced by an external magnetic field between the two different coercive forces Hc, exhibiting a resistance change of about 10% at a magnetic field of about 100 Oe.

Also Japanese Patent Application Kokai (JP-A) No. 218982/1992 proposes a structure wherein magnetic thin films disposed adjacent each other via a non-magnetic layer have different Hc, each of the layers having a thickness of up to 200 Å. In Japanese Patent Application No. 203562/1991 which was filed prior to the above-identified application, the magnetic layers have a specific squareness ratio. J. Mag. & Mag. Mater., Vol. 99, page 243, 1991 discusses about a magnetoresistance change ratio and a temperature change of resistivity.

However, the MR magnetic head using a giant MR film of the induced ferrimagnetic type experiences a substantial change with time or has the problem that it produces a high output at the initial, but the output gradually drops.

Physical Review B, Vol. 43, page 1297, 1991, proposes a multilayer film allegedly of the spin-valve effect. This multilayer film includes a sandwich of a magnetic layer of NiFe or the like having a pinning layer of Fe-Mn deposited thereon and a magnetic layer with a non-magnetic layer interleaved therebetween such that antiparallel magnetizations of the magnetic layers are induced by an external magnetic field between the magnetic layer's Hc and the magnetic layer-pinning layer exchange interaction energy, thereby providing a large magnetoresistance change. This was also found to experience a large output drop with time like the previous ones.

DISCLOSURE OF THE INVENTION

A primary object of the present invention is to provide a magnetic field detecting apparatus having a structure for maintaining stable the output of a giant MR multilayer film of the induced ferrimagnetic or spin-valve type and a method for preventing output drop of a multilayer film.

Regarding a magnetic field detecting apparatus including a MR sensor whose output has been reduced, the inventors have found that the output of the MR sensor is increased again by adding to the apparatus a mechanism for applying a magnetic field to the MR sensor. Namely, the above object is achieved by the present invention which is defined below as (1) to (12).

(1) An apparatus comprising a magnetic field sensor having a giant magnetoresistive multilayer film, said apparatus detecting a magnetic field using the magnetoresistive multilayer film, wherein said magnetoresistive multilayer film includes multiple magnetic layers built therein such that antiparallel magnetizations of the magnetic layers are induced by external magnetization, a means for generating a magnetic field is provided, and said magnetic field sensor is moved to the proximity of said magnetic field generating means and placed within the magnetic field, thereby preventing output drop of said magnetoresistive multilayer film.

(2) The magnetic field detecting apparatus of (1) wherein said apparatus is a magnetic recording/reproducing apparatus for performing recording and reproduction on a magnetic recording medium and said magnetic field sensor is a magnetoresistive head.

(3) The magnetic field detecting apparatus of (1) wherein said magnetic field generating means is a permanent magnet.

(4) The magnetic field detecting apparatus of (1) wherein said magnetic field generating means is an electromagnet or a coil.

(5) The magnetic field detecting apparatus of (1) wherein said magnetic field generating means applies a magnetic field of 100 to 5,000 Oe across said magnetoresistive multilayer film.

(6) The magnetic field detecting apparatus of (1) wherein said magnetoresistive multilayer film includes a sandwich of magnetic layers of at least two types having different coercive forces with a non-magnetic layer interleaved therebetween.

(7) The magnetic field detecting apparatus of (6) wherein among the magnetic layers, those higher coercive force magnetic layers have a coercive force of 80 to 400 Oe.

(8) The magnetic field detecting apparatus of (1) wherein said magnetoresistive multilayer film includes a sandwich of a magnetic film and another magnetic film having a pinning layer with a non-magnetic layer interleaved therebetween.

(9) The magnetic field detecting apparatus of (1) wherein said magnetic layer has a coercive force of 0.01 to 10 Oe.

(10) The magnetic field detecting apparatus of (2) wherein said magnetoresistive multilayer film is laminated substantially parallel to a normal direction to the surface of said magnetic recording medium and said magnetic field generating means applies a magnetic field in said normal direction.

(11) A method for preventing output drop with time of a magnetoresistive multilayer film which includes multiple magnetic layers built therein such that antiparallel magnetizations of the magnetic layers are induced by external magnetization, said method comprising the step of:

applying a magnetic field to said magnetoresistive multilayer film in a non-use period.

(12) The method for preventing output drop of a magnetoresistive multilayer film according to (11) wherein said magnetoresistive multilayer film is the multilayer film of the magnetic field sensor of the magnetic field detecting apparatus of (1) to (10).

OPERATION

A magnetic field sensor using a multilayer film of the induced ferrimagnetic or spin-valve type exhibiting a giant magnetoresistance change as used herein is subject to a change with time for demagnetization and gradually lowers its output. When the above-mentioned mechanism applies a magnetic field to the magnetic layers such that the layers are magnetized approximately to their saturation whereby the layers are initialized to align their spin unidirectionally, the sensor readily restores its performance.

ILLUSTRATIVE CONSTRUCTION

Figure 1:
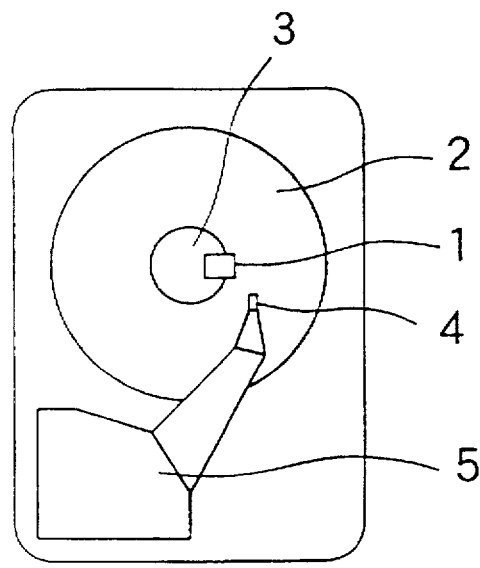
FIG. 1 is a plan view of a magnetic disk apparatus according to the present invention.

Now the illustrative construction of the present invention is described in detail.

The magnetoresistive film of the induced ferrimagnetic type used herein is one in which an artificial multilayer film structure induces antiparallel magnetization between two different Hc magnetic layers disposed adjacent each other through a non-magnetic layer as described in J. Mag. & Mag. Mater., Vol. 99, page 243, 1991. This film has a significantly large MR ratio of 5 to 18% as compared with MR films of conventional Permalloy and other alloys. The film ensures high sensitivity when used as a MR sensor. Since the MR curve has a certain slope at zero, the film can be used without a biasing magnetic field applied, enabling to simplify the device structure.

Typical exemplary compositions are shown below together with their magnetoresistance ratio.

| No. | Exemplary composition | Resistance ratio (%) |
|---|---|---|
| 1 | [Cu(50)—Co(10)—Cu(50)—NiFe(10)] × 10 | 5.1 |
| 2 | [Cu(50)—Co(15)—Cu(50)—NiFe(15)] × 10 | 7.5 |
| 3 | [Cu(50)—Co(20)—Cu(50)—NiFe(20)] × 10 | 7.7 |
| 4 | [Cu(35)—Co(10)—Cu(50)—NiFe(10)] × 10 | 6.6 |
| 5 | [Cu(50)—Co(10)—Cu(50)—NiFe(15)] × 10 | 6.2 |
| 6 | [Cu(50)—Co(10)—Cu(50)—NiFe(20)] × 10 | 7.5 |
| 7 | [Cu(42)—Co(10)—Cu(42)—NiFe(13)] × 5 | 8.0 |
| 8 | [Cu(47)—Co(12)—Cu(47)—NiFe(10)] × 5 | 7.2 |

The expression of exemplary compositions means for No. 1, for example, a film structure including ten iterative unit structures each obtained by successively depositing layers of copper of 50 Å thick, cobalt of 10 Å thick, copper of 50 Å thick, and NiFe of 10 Å thick. The film thickness is 1,200 Å for No. 1. Herein coercive force will vary with material and thickness. Among magnetic layers of at least two types, the higher coercive force (Hc) magnetic layer has a Hc of about 80 to 500 Oe and the lower Hc magnetic layer has a Hc of about 0.01 to 10 Oe. Each of these magnetic layers is measured for Hc by depositing a magnetic layer to be examined and a non-magnetic layer under the same conditions to the same number of stacking layers as in the actual manufacture.

Also the magnetic layers are about 8 to 100 Å thick, the non-magnetic layers are about 20 to 80 Å thick, and the total thickness is about 150 to 1,500 Å. The type of the magnetic layers used herein is not critical although preferred are Fe, Ni, Co, Mn, Cr, Dy, Er, Nd, Tb, Tm, Ce, Gd, etc., to name a few. Preferred among alloys and compounds containing these elements are, for example, Fe-Si, Fe-Ni, Fe-Co, Fe-Al, Fe-Al-Si (Sendust etc.), Fe-Ni-Co, Fe-Y, Fe-Gd, Fe-Mn, Co-Ni, Cr-Sb, Fe base amorphous alloys, Co base amorphous alloys, Co-Pt, Co-Sm, Nd-Fe, Fe-Al, Fe-C, Mn-Sb, Ni-Mn, Co-O, Ni-O, Fe-O, Fe-Al-Si-N, Ni-Fe, ferrites, etc. Among these magnetic materials, two or more materials having different coercive forces are chosen to form magnetic thin films.

The non-magnetic thin films used herein are of a material playing the role of weakening the magnetic interaction between magnetic thin films having different coercive forces. The type of non-magnetic material is not critical and a proper choice may be made among various metal and metalloid non-magnetic materials and non-metallic non-magnetic materials. Preferred metal non-magnetic materials include Au, Ag, Cu, Pt, Al, Mg, Mo, Zn, Nb, Ta, V, Hf, Sb, Zr, Ga, Ti, Sn, Pb, etc. and alloys thereof. Preferred metalloid non-magnetic materials include Si, Ge, C, B, etc., with or without another element added thereto. Preferred non-metallic non-magnetic materials include $SiO_2$, SiO, SiN, $Al_2O_3$, ZnO, MgO, TiN, etc., with or without another element added thereto.

For the spin-valve type, the above-mentioned magnetic layers and non-magnetic layers are used, and a pinning layer is applied to one magnetic layer opposed to the other magnetic layer via the non-magnetic layer interleaved therebetween. Any pinning layer is usable insofar as it can pin the adjoining magnetic layer. Exemplary are Fe-Mn, nickel oxide, iron oxide, Co-Pt, Co-Sm, Fe-Nd, Co-Ni, Co-P, Co-Ni-P, Fe-Tb, Co-Tb, Co-Fe, etc. The pinning layer is disposed such that a pair of magnetic layers are opposed through the non-magnetic layer although various other configurations are acceptable, for example, a configuration having a pinning layer interleaved between the magnetic layers. Provision is made such that an external magnetic field can induce antiparallel magnetization between the magnetic layers opposed through the non-magnetic layer.

The magnetic layers are about 10 to 100 Å thick, the non-magnetic layers are about 6 to 80 Å thick, the pinning layers are about 20 to 300 Å thick, and the total thickness is about 50 to 1,000 Å. The magnetic layers have a Hc of about 0.01 to 10 Oe, and the exchange interaction energy between the pinning layer and the magnetic layer is about 0.001 to 100 erg/cm$^2$. The Hc of the magnetic layer is measured by the same procedure as previously described, without forming the pinning layer. Where magnetic layers are of two types, Hc measurement is by the same procedure as previously described.

Exemplary compositions are described below.

| No. | Exemplary composition | Resistance ratio (%) |
|---|---|---|
| 11 | [FeMn(100)—NiFe(30)—Cu(30)—NiFe(30)] × 1 | 2.8 |
| 12 | [FeMn(80)—NiFe(25)—Cu(25)—NiFe(30)] × 2 | 3.6 |
| 13 | [CoPt(80)—NiFe(30)—Cu(30)—NiFe(40)] × 1 | 2.3 |
| 14 | [FeMn(150)—Co(40)—Cu(20)—NiFe(40)] × 2 | 7.2 |
| 15 | [FeMn(70)—NiFe(70)—Cu(27)—NiFe(60)] × 2 | 3.2 |

It is to be noted that each of these layers may be deposited by molecular beam epitaxy (MBE), sputtering or evaporation.

The magnetic field generating means desirably generates a magnetic field having an intensity of 100 to 5,000 Oe, preferably 150 to 500 Oe where the multilayer film is disposed closest to the magnetic field generating source. A lower intensity would not ensure sufficient output recovery whereas with a higher intensity, a leakage magnetic flux to the magnetic recording medium would exacerbate reliability.

The magnetic field generating means includes a magnetic field generating source which may be an electromagnet or coil across which current is conducted to generate a magnetic field only when necessary, or a permanent magnet. Where reliability is of significance, an electromagnet or coil is used despite complex structure. Where a simple structure is of significance, a permanent magnet is used. The permanent magnet which can be used herein include bulk ferrite magnets, rare earth element magnets, and thin film magnets such as CoPt and SmCo. If desired, the magnetic field generating source may be provided with a shield against magnetic field leakage.

The time when the MR multilayer film resides in the magnetic field for output recovery is not critical insofar as it is at least about 0.001 second. The magnetic field may be an alternating magnetic field although it is generally a unidirectional magnetic field.

It suffices that the magnetic field has an in-plane component of the multilayer film although it is preferred to apply a magnetic field substantially parallel to the film surface. In general, the multilayer film of the MR head is disposed substantially parallel to a normal direction to the surface of a magnetic recording medium such that a perpendicular component thereof may be detected. Therefore, in general practice, a magnetic field for preventing output drop is applied substantially parallel to a normal direction to the surface of a magnetic recording medium.

The timing of applying a magnetic field may be periodic during non-use of the head or continuous or intermittent after completion of a predetermined operation although it is possible to monitor the sensor output and apply a magnetic field upon detection of an output drop.

EMBODIMENT

Some exemplary embodiments of the invention are given below by way of illustration.

Figure 2:
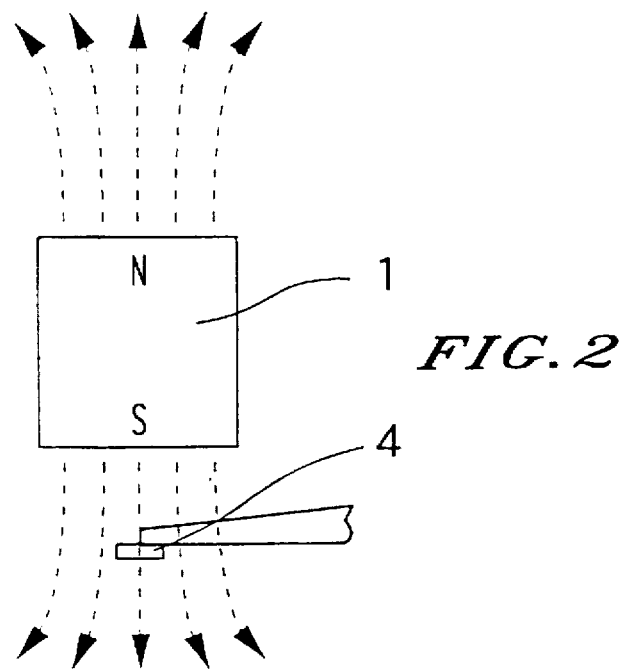
FIG. 2 is a side view of the permanent magnet used in the apparatus of FIG. 1.

FIG. 1 illustrates a magnetic disk apparatus according to one embodiment of the invention. A MR sensor using an induced ferrimagnetic multilayer film is incorporated in an inductive/MR composite magnetic head 4. During normal recording/reproducing operation, the magnetic head 4 is moved above and across a magnetic recording disk 2. It is a common practice that when no recording/reproducing operation is done, the magnetic head 4 is moved by means of a positioner 5 to a location corresponding to the innermost circumference of the disk where no information has been written in. In the vicinity of a spindle 3 located at the inner circumference of the disk for driving the disk for rotation, is disposed a permanent magnet 1 as shown in FIG. 2. The permanent magnet used in this example is a NdFeB system sintered magnet dimensioned 2 mm square. When the head 4 is moved to the innermost circumference, a magnetic field of approximately 300 oersted is applied to the magnetoresistive multilayer film.

Figure 3:
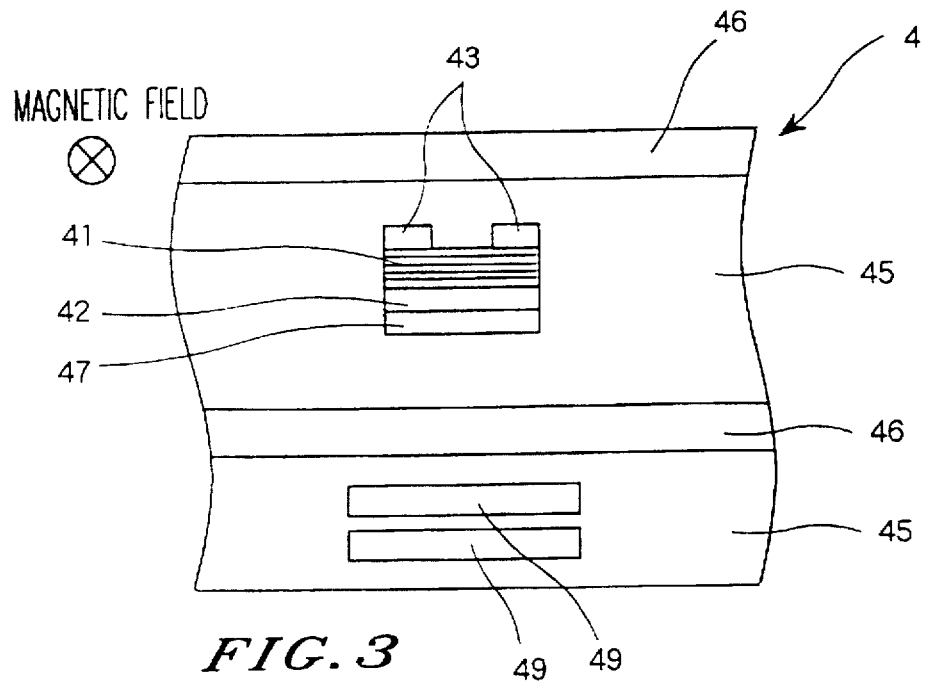
FIG. 3 is a bottom view of the magnetic head used in the apparatus of FIG. 1.

FIG. 3 illustrates the structure of the magnetic head 4 at the front surface which is opposed to the disk. The head 4 illustrated herein includes a multilayer film 41 formed in an insulating layer 45, with the respective layers of the multilayer film 41 being successively stacked from bottom to top in the figure. Connected to the magnetic multilayer film 41 are electrodes 43, 43, for example, of Cu, Ag or Au, for conducting measurement current to the film 41 and a shunt layer 42, for example, of Ti. The insulating layer 45 is preferably of oxides commonly used as an insulating layer, for example, $SiO_2$, SiO, and $Al_2O_3$. The multilayer film 41 is sandwiched between shields 46, 46, for example, of Sendust and Permalloy. Further, a layer 47 of a soft magnetic material having a high resistivity such as CoZrMo and NiFeRh is disposed below the shunt layer 42 for applying a biasing magnetic field, if desired. In this way, the multilayer film 41 is laminated such that the film surface is substantially parallel to a normal direction to the head front surface (or a normal direction to the disk) and exposed at the front surface. Understandably, a yoke type MR head having a multilayer film built in the head interior is also acceptable in which a yoke for conducting magnetic flux is disposed internally from the front surface and partially notched where a multilayer film is formed. Also acceptable is a flux guide type head in which a pattern for conducting magnetic flux is formed of high resistivity material such as NiFeRh and a multilayer film is formed in magnetic coupling therewith. Also in these examples, the film surface of the multilayer film is generally normal to the disk surface. Disposed below the MR head portion is an inductive head portion of a thin film structure having magnetic poles 49, 49.

A comparative example was a magnetic disk apparatus of the same construction as above except that the permanent magnet was omitted.

The medium was of CoNiPt system thin film type and had a coercive force of 1,600 oersted. The head-medium spacing was set at 0.15 microns. Recording was done using the inductive head portion having a track width of 15 microns and a gap distance of 0.1 micron.

Recording/reproducing cycles each consisting of continuous recording/reproducing operation at 5 MHz for approximately 10 minutes and subsequent 10-minute quiescence were repeated. During the quiescent time when no recording/reproducing operation was done, the head 4 was moved to the inner circumference of the disk by means of the positioner 5 such that the MR sensor resided in the magnetic field of the magnet 1 in the case of the inventive apparatus.

Figure 4:
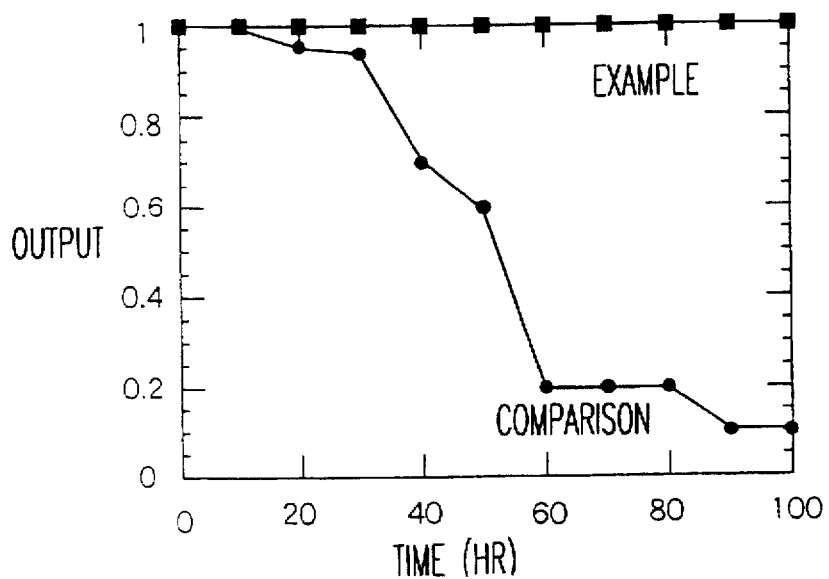
FIG. 4 is a graph showing a change with time of the output of a magnetic disk, the head output normalized relative to the initial output being plotted on the ordinate and the lapse of time being plotted on the abscissa.

FIG. 4 shows the results obtained when induced ferrimagnetic multilayer film No. 7 previously identified was used. The reproduction output normalized relative to the initial output is plotted on the ordinate and time is plotted on the abscissa of FIG. 4. It is seen that the magnetic disk apparatus of the invention experiences no output drop over a long period of time. Equivalent results were obtained from any of compositions and layer constructions for both the induced ferrimagnetic and spin-valve types.

The benefits of the invention are evident from these results. More specifically, the present invention ensures that a magnetic field detecting apparatus using a magnetic multilayer film of the induced ferrimagnetic type produces an output which is consistently maintained high over a long period of time.

Figure 5:
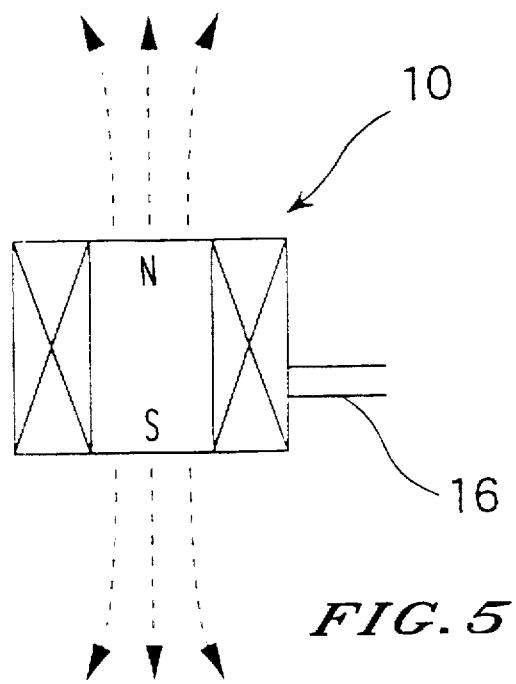
FIG. 5 is a side view of an electromagnet which can be used instead of the permanent magnet of FIG. 2.

Understandably, although the permanent magnet 1 is used in the foregoing example, an electromagnet 10 having an exciting wire 16 as shown in FIG. 5 may also be used. It may be disposed at the inner circumference of the disk. The use of the electromagnet 10 ensures more precise control although the use of a permanent magnet is preferred from the standpoints of simplicity and size reduction of the apparatus because the present invention only requires that the multilayer film be magnetized to or near its saturation.

Figure 6:
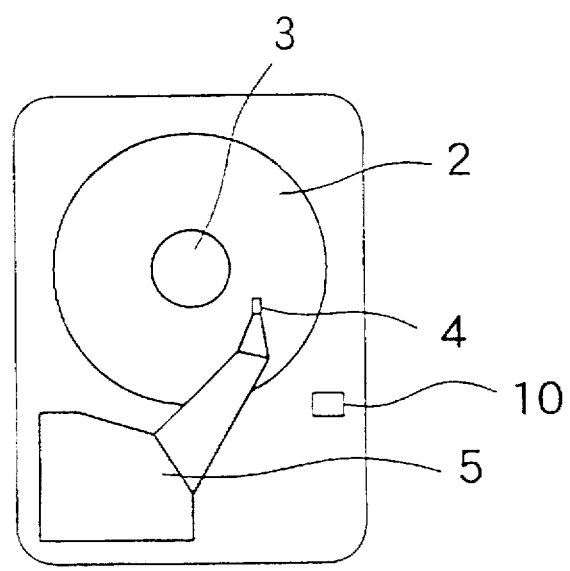
FIG. 6 is a plan view of another exemplary magnetic disk apparatus according to the present invention.
Figure 7:
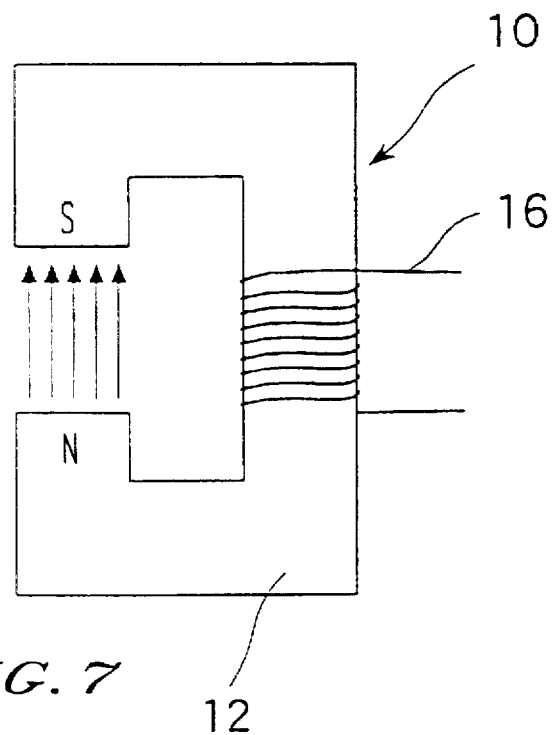
FIG. 7 is a side view of the electromagnet used in the apparatus of FIG. 6.
Figure 8:
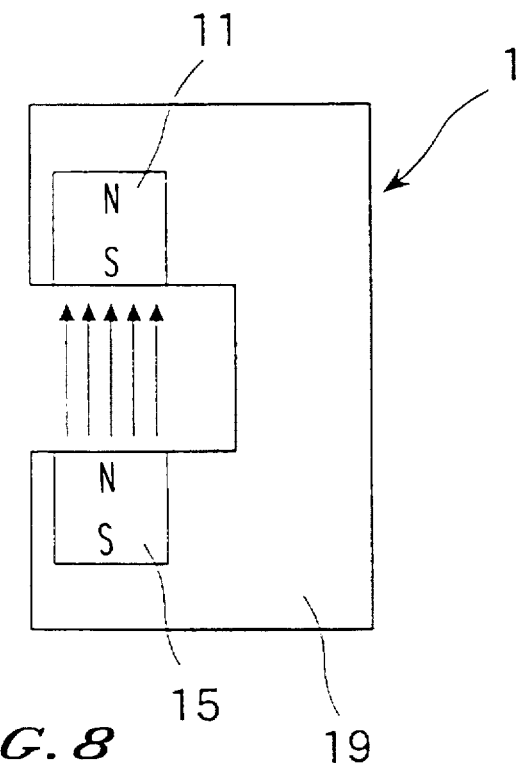
FIG. 8 is a side view of a permanent magnet which can be used instead of the electromagnet of FIG. 7.

Moreover, FIG. 6 illustrates another embodiment wherein an electromagnet 10 is disposed outside the outer circumference of the disk. When the electromagnet is used, apparatus design is simplified by locating the electromagnet outside the disk. In the embodiment shown in FIG. 7, the electromagnet 10 includes a C-shaped core 12 having opposed surfaces defining a gap and an exciting wire 16 for generating a magnetic field between the gap-defining opposed surfaces, which is applied to the head 4 disposed in the gap. Alternatively, the electromagnet 10 can be designed such that a magnetic field is applied to the head from one end surface of the core of FIG. 5. Also a permanent magnet 1 as shown in FIG. 8 may be located outside the disk. This magnet includes opposed S and N magnet portions 11 and 15 which are fixedly received in a molded resin casing 19 such that the magnetic head may be inserted in the gap between the opposed S and N magnet portions 11 and 15.

The magnetic disk apparatus is operated as follows. With the apparatus switch turned on, the disk 4 starts rotating. Then the head 4 is moved close to the magnetic field generating means, preferably by means of the positioner 5. Application of a magnetic field is followed by normal recording/reproducing operation.

In such a situation, better results are obtained when the head has a home position where a magnetic field is applied from the magnetic field generating means so that the head always returns to the home position except during normal recording operation. Alternatively, provision is made such that the head may return to the home position upon detection of any abnormal output, if necessary.

BENEFIT

The present invention ensures that a magnetic field detecting apparatus using a giant MR multilayer film of the induced ferrimagnetic or spin-valve type continuously produces a high output.

We claim:

1. A method for preventing output drop with time of a magnetoresistive multilayer film comprising the steps of:

providing a magnetic field separately from a magnetoresistive multilayer film which comprises multiple magnetic layers built therein such that antiparallel magnetization of the magnetic layers are induced by external magnetization, using said magnetoresistive multilayer film when not within a proximity of said magnetic field, applying said magnetic field to said magnetoresistive multilayer film in a non-use period sufficient to prevent output drop of said magnetoresistive multilayer film.

2. The method for preventing output of a magnetoresistive multilayer film according to claim 1 wherein said magnetoresistive multilayer film is a multilayer film of a magnetic field sensor of a magnetic field detecting apparatus wherein said apparatus comprises:

i) a magnetic field sensor having a giant magnetoresistive multilayer film for detecting a magnetic field; and ii) a means for generating a magnetic field, wherein said magnetoresistive multilayer film includes multiple magnetic layers built therein such that antiparallel magnetizations of said magnetic layers are induced by external magnetization; and when said magnetic field sensor is moved to a proximity of said magnetic field generating means and placed within a magnetic field generated thereby output drop of said magnetoresistive multilayer film is prevented.

* * * * *